(12) United States Patent  
Takahashi et al.

(10) Patent No.: US 7,520,052 B2  
(45) Date of Patent: Apr. 21, 2009

(54) METHOD OF MANUFACTURING A SEMICONDUCTOR DEVICE

(75) Inventors: Yoshimi Takahashi, Beppu (JP); Masazumi Amagai, Tsukuba (JP)

(73) Assignee: Texas Instruments Incorporated, Dallas, TX (US)

( * ) Notice: Subject to any disclaimer, the term of this patent is extended or adjusted under 35 U.S.C. 154(b) by 160 days.

(21) Appl. No.: 11/426,622

(22) Filed: Jun. 27, 2006

(65) Prior Publication Data

US 2006/0292753 A1  Dec. 28, 2006

(30) Foreign Application Priority Data

Jun. 27, 2005 (JP) ............... 2005-187137  
Jun. 27, 2005 (JP) ............... 2005-187175

(51) Int. Cl.  
*H05K 3/30* (2006.01)

(52) U.S. Cl. ............. 29/841; 29/832; 264/272.14; 438/127

(58) Field of Classification Search ............ 29/832, 29/834, 840, 841, 846; 438/108, 110, 114, 438/125–127; 257/686; 264/272.14  
See application file for complete search history.

(56) References Cited

U.S. PATENT DOCUMENTS 5,594,275 A * 1/1997 Kwon et al. ............... 257/686  
6,344,162 B1 * 2/2002 Miyajima ............... 264/272.14

* cited by examiner

*Primary Examiner*—Donghai D. Nguyen  
(74) *Attorney, Agent, or Firm*—Yingsheng Tung; Wade James Brady, III; Frederick J. Telecky, Jr.

(57) ABSTRACT

The objective of the invention is to provide a method of manufacturing a semiconductor device that allows individual molding of plural semiconductor chips carried on a surface of the substrate. It includes the following process steps: a process step in which plural semiconductor elements 102 are arranged on the surface of substrate 100; a process step in which the inner side of substrate 102 is fixed on lower die 130; a process step in which liquid resin 114 is supplied from nozzle 112 onto each of the semiconductor elements in order to cover at least a portion of each of semiconductor chips 102; a process step in which the upper die having plural cavities 144 formed in one surface is pressed onto the lower die, and liquid resin 114 is molded at a prescribed temperature by means of plural cavities 144; and a process step in which cavities 144 of upper die 140 are detached from the substrate, and plural molding resin portions are formed individually.

27 Claims, 10 Drawing Sheets

| CHARACTERISTICS OF THE LIQUID RESIN | | |
|---|---|---|
| | CONDITION A | CONDITION B |
| GLASS TRANSITION TEMPERATURE (Tg) | 100-160°C | 130-160°C |
| CTE1: LINEAR EXPANSION COEFFICIENT | 20-30 ppm | 24-25 ppm |
| CTE2: LINEAR EXPANSION COEFFICIENT | 80-120 ppm | 90-100 ppm |
| YM1: LONGITUDINAL MODULUS | 1-20 GPa | 9-11 GPa |
| YM2: LONGITUDINAL MODULUS | 0.1-1.0 GPa | 0.2-0.5 GPa |

*FIG. 12(a)*

| | |
|---|---|
| HEIGHT OF MOLDING RESIN FROM THE SURFACE OF THE SUBSTRATE | 0.27mm |
| THICKNESS OF CHIP | 0.1mm |
| THICKNESS OF DIE ATTACHMENT | 0.025mm |
| THICKNESS OF SUBSTRATE | 0.3mm |
| HEIGHT FROM THE INNER SURFACE OF THE SUBSTRATE TO THE BOTTOM SURFACE OF THE SOLDER BALL | 0.23mm |

*FIG. 12(b)*

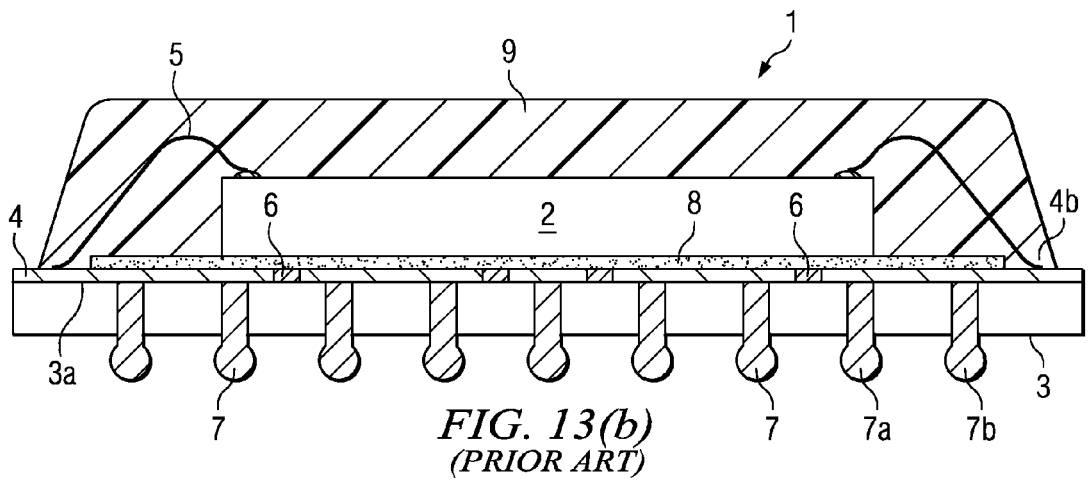

*FIG. 13(b)*
*(PRIOR ART)*

METHOD OF MANUFACTURING A SEMICONDUCTOR DEVICE

FIELD OF THE INVENTION

The present invention is concerned with the methods for sealing plural semiconductor chips mounted on one surface of a substrate, especially a molding method which can be adapted for the development of small, thin semiconductor devices.

The popularity of cell phones, portable computers, and other small electronic equipment, has created ever-increasing demand for the development of small, thin semiconductor devices installed in them. In order to meet this demand, researchers have developed BGA and CSP packages, which have been adopted in practical applications.

Patent Reference 1 discloses a type of BGA package. As shown in FIG. 13, plural copper pattern portions 4 are formed on the surface of insulating film substrate 3 made of polyimide for electric connection between semiconductor chip 2 and solder bumps 7. One end of each said copper pattern portion 4 is connected via through-hole 3a formed in insulating film substrate 3 to solder bump 7. The other end of copper pattern portion 4 is connected to one end of conductor wire 5 that extends from electrode pad 2a of semiconductor chip 2. Solder resist 6 made of epoxy resin is coated on insulating substrate 3 containing said copper pattern portions 4. Said semiconductor chip 2 is bonded on die attaching tape 8. It is then sealed in molding resin 9 molded using the transfer molding method.

Also, Patent Reference 2 discloses a type of molding die that performs resin molding for workpieces to be molded having plural semiconductor chips mounted in a matrix shape on one surface of the substrate, and a resin molding method using said molding die. FIG. 14(b) is a diagram illustrating an example of the semiconductor package of the QFN (Quad Flat Non-leaded) type. In this case, semiconductor chips 52 are mounted in a matrix configuration on die pad portion 57 on one surface of leadframe 56 as the workpiece to be molded. Each semiconductor chip 52 and its surrounding lead portion 58 are wire bonded, and the electrode portion of semiconductor chip 52 and one surface of lead portion 58 serving as the terminal connecting portion are electrically connected to each other by bonding wires 54. When resin substrate 51 and leadframe 56 are carried on lower die 59, semiconductor chips 52 arranged in a matrix configuration are accommodated in cavity recess 60. Said resin substrate 51 and leadframe 56 are clamped at the peripheral edge portion of the substrate by upper die 61 and lower die 59. The molding resin is supplied through lower runner gate 62 to fill cavity recess 60 so that one surface is resin molded as a block. After resin molding, the molding (resin substrate 51 and leadframe 56) is diced into pieces, each containing a semiconductor chip. The semiconductor devices are manufactured in this way. C represents the dicer cutting lines.

[Patent Reference 1] Japanese Kokai Patent Application No. 2000-31327

[Patent Reference 2] Japanese Kokai Patent Application No. 2003-234365

However, the aforementioned molding methods of the prior art have the following problems. As shown in FIG. 14, when plural semiconductor chips mounted on a surface of the substrate are molded as a block, cracks develop at the cut surfaces of the molding resin when it is cut along the dicer cutting lines C. Also, particles are generated in conjunction with cutting. In addition, when the plural semiconductor chips are molded as a block, it is necessary to feed unnecessary resin between adjacent semiconductor chips, so that wasted resin results. This hampers efforts to make the outer dimensions of the molding resin smaller and thinner.

Also, the stacked IC package assembly form has become popular. A stacked IC package is supplied through a reflowing oven while it is assembled on a mother substrate, exposing it to a high temperature. As a result, the difference in thermal expansion coefficients of the principal materials used in the package cause mechanical warping. This warping prevents the terminals of the package (solder balls) from making contact with the terminals on the mother substrate, leading to contact defects.

Stacked IC packages usually make use of the transfer molding scheme. In this scheme, hot liquefied resin is poured into an injection port known as a gate, and the gate is mechanically cut after partial curing of the resin in order to form an integral molding. Because the gate is cut mechanically, the outer dimensional accuracy and the appearance of the package may become defective. In addition, residual resin is created after resin sealing, and this leads to poor assembly when the IC package is stacked.

The objective of the present invention is to solve the aforementioned problems of the prior art by providing a method of manufacturing a semiconductor device that allows individual molding of plural semiconductor chips mounted on one surface of a substrate.

In addition, the objective of the present invention is to provide a method of manufacturing a semiconductor device that can make the molded resin over the plural semiconductor chips mounted on one surface of the substrate be small and thin.

In addition, the objective of the present invention is to provide a type of semiconductor device and its manufacturing method that allows another surface assembly type of semiconductor device to be stacked on the surface where the molding resin is formed.

SUMMARY OF THE INVENTION

The present invention provides a method of manufacturing a semiconductor device characterized by the following facts: in a method of manufacturing a semiconductor device wherein semiconductor elements are mounted on a substrate sealed with a resin, plural semiconductor elements are arranged on the first principal surface of the substrate; the second principal surface opposite to the first principal surface of the substrate is fixed on a supporting part (lower die); a liquid resin is supplied to each of the semiconductor elements to cover at least a portion of each semiconductor element; a mold part (upper die) having plural recesses (cavities) formed in one surface is pressed onto the supporting member, and the liquid resin for each semiconductor element is molded within each said recess at a prescribed temperature; and the recesses of the mold part are released from the substrate.

The process step in which the liquid resin is supplied includes a process step in which a nozzle for supplying liquid resin is driven to scan the first principal surface of the substrate. It is preferred that the quantity supplied be in the range of ±3% with respect to the volume of the recess of the mold part. Also, it is preferred that the liquid resin be in liquid form at room temperature, and it have a viscosity in the range of 30-150 Pa·s.

The liquid resin is molded at about 150° C. In this case, a flexible film may be adhered on the plural recesses of the mold part. The flexible film acts as a mold release material for the molding resin. It is preferred that the softening temperature of the film be near the temperature at which the liquid resin is molded. In addition, the surface of the film that is to contact the plural recesses is rough, and the film is preferably at least 50 μm thick so that it can cover the steps formed on the substrate. For example, the film is made of a thermoplastic fluorine-containing resin (ETFE).

For the manufacturing method, it is preferred that there also be a process step in which the atmosphere around the liquid resin is evacuated before molding the liquid resin by means of the recesses of the mold part. Because the atmosphere of the semiconductor element is evacuated, it is possible to inhibit gas bubbles and voids in the molding resin. The degree of absolute vacuum is 5 kPa or better.

In addition, the mold part contains plural pressing members with recesses formed in them, and the various pressing members are independently supported in an elastic way. The liquid resin supplied to each semiconductor element is pressed individually.

The manufacturing method also includes a process step in which the substrate is cut to correspond to the area of the molded semiconductor elements, a process step in which connecting terminals are attached on the second principal surface, and a process step in which another semiconductor device is stacked onto the first principal surface of the substrate.

The semiconductor device of the present invention has another semiconductor device stacked onto the semiconductor device manufactured in the aforementioned process step. In this case, a wiring pattern is formed on the first principal surface of the substrate, and the plural connecting terminals formed on the inner surface of another semiconductor device are electrically connected to the aforementioned wiring pattern. For example, the connecting terminals of said another semiconductor device are for BGA or CSP packages, and these terminals are arranged on the outer periphery of the molding resin. As a result, the molding resin is sandwiched between the substrate of said semiconductor device and said another semiconductor device.

BRIEF DESCRIPTION OF THE DRAWINGS

FIG. 1.

FIG. 7(a) is a plan view of a substrate with molding resin formed on it. FIG. 7(b) is a cross section taken across A1-A1.

FIG. 8(a) is a plan view of the upper die as seen from the inner side, and FIG. 8(b) is a cross section of the chamfer portion.

FIG. 12(a) is a table listing the resin characteristics of the liquid resin and FIG. 12(b) is a table listing the dimensions of the main portion of the semiconductor device.

FIG. 13(a) is an oblique view of a conventional BGA and FIG. 13(b) depicts a portion of the cross section of a conventional BGA package.

REFERENCE NUMERALS AND SYMBOLS AS SHOWN IN THE DRAWINGS

In the figures, 100 represents a substrate, 102, 210, 304, 306 represent semiconductor chips, 104, 212 represent bonding wires, 110 represents a container, 112 represents a nozzle, 114 represents a liquid resin, 130 represents a lower die, 140 represents an upper die, 142 represents a release film, 144 represents a cavity, 146 represents a pressure member, 150 represents an air suction hole, 152 represents a leg portion, 160, 184, 206, 410 represent molding resin, 170, 186 represent chamfers, 180 represents an air pocket, 182 represents a land, 188 represents a protrusion, 200 represents a first semiconductor device, 202 represents a multilayer wiring substrate, 204 represent solder balls, 208 represents a die attachment, 300 represents a second semiconductor device.

DESCRIPTION OF THE EMBODIMENTS

According to the present invention, it is preferred that resin sealing of the plural semiconductor elements formed as a block on one surface of the substrate be performed individually. As a result, it is possible to provide a small, thin semiconductor device. In addition, because plural semiconductor elements are individually sealed by resin, it is possible to prevent waste of the molding resin. At the same time, it is possible to obtain individual semiconductor devices without dicing the molding resin, so that the shear stress or the like that results when the molding resin is cut is not directly applied. Consequently, no cracks are generated in the molding resin, the dimensional accuracy of the molding resin becomes consistent, and a high-quality appearance can be guaranteed.

PREFERRED EMBODIMENT OF THE INVENTION

In the following, preferred embodiments of the present invention will be explained with reference to figures.

Figure 1A:
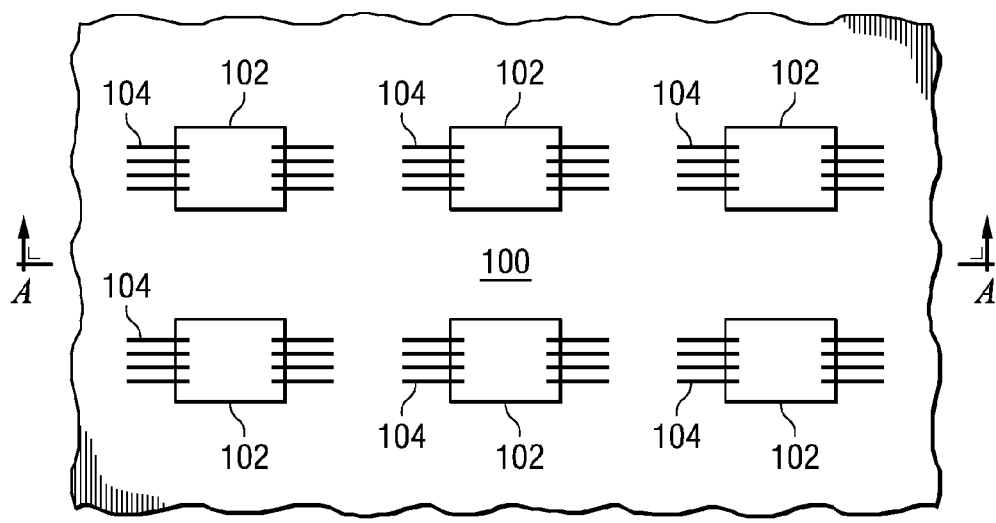
FIG. 1(a) is a plan view of a substrate with plural semiconductor chips mounted on it.
Figure 1B:
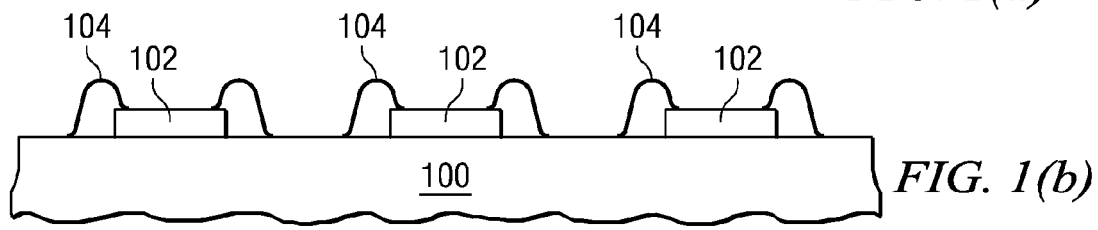
FIG. 1(b) is a cross section taken across line A-A.

FIG. 1(a) is a plan view illustrating a substrate with plural semiconductor chips mounted on it, and FIG. 1(b) is a cross section taken across A-A. In the first embodiment, plural semiconductor chips are set in matrix configuration on one surface of substrate 100. There is no special limitation on the constitution of said substrate 100. It is possible to adopt multilayer wiring substrates and film substrates. For example, a glass epoxy resin, polyimide resin, or other insulating substrate can be used. Said semiconductor chips 102 are attached via die attachment or the like at the prescribed positions of substrate 100. The electrodes of semiconductor chips 102 are connected to the copper pattern formed on the surface of substrate 100 by means of bonding wires 104.

Figure 2:
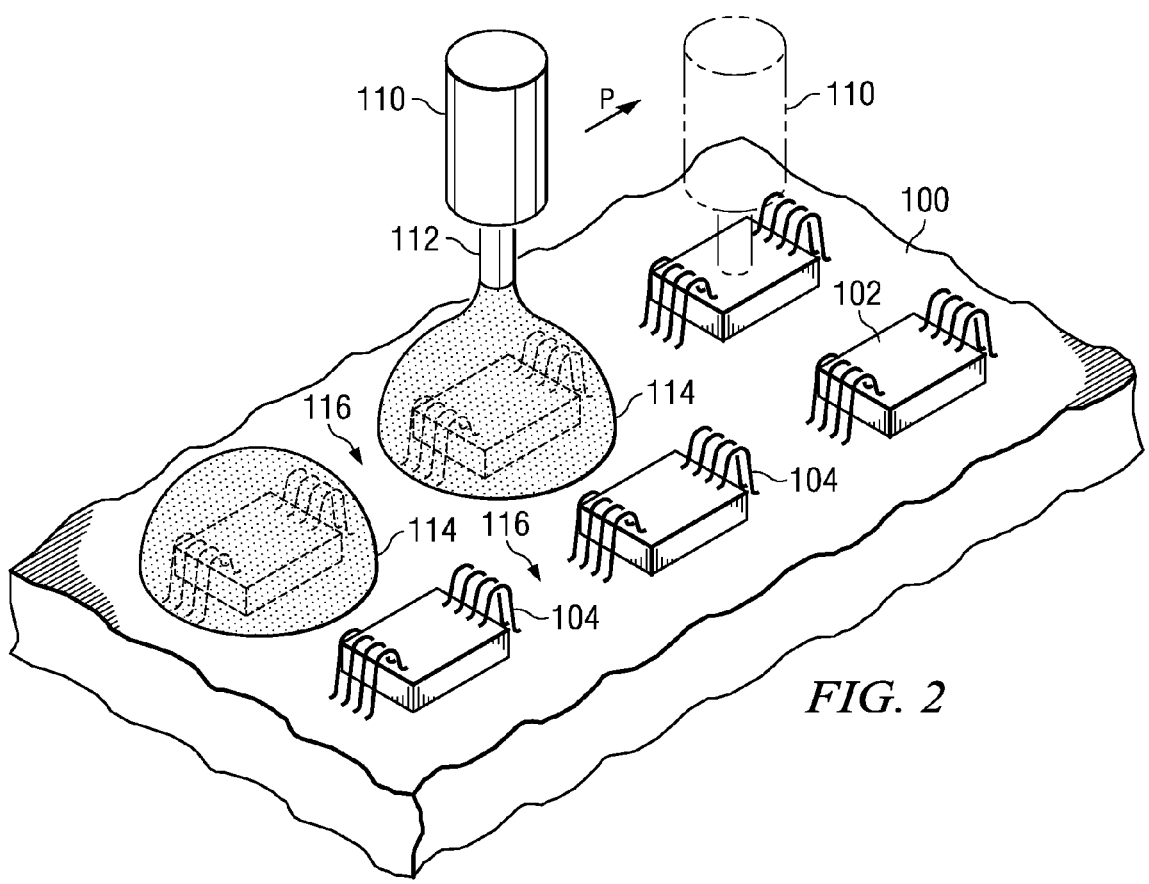
FIG. 2 is a diagram illustrating a process in the molding method in an embodiment of the present invention.

In the following, the method will be explained for individually molding said semiconductor chips 102 mounted on the substrate shown in FIG. 1 as a block. As shown in FIG. 2, container 110 filled with liquid resin is driven to scan substrate 100 in longitudinal direction P, and liquid resin 114 is fed from tip nozzle 112 onto substrate 100. In this case, liquid resin 114 is supplied intermittently from tip nozzle 112 to cover the surface of individual semiconductor chips 102. As a result, liquid resin 114 is not supplied to regions 116 between semiconductor chips 102, so that the substrate there is left exposed. The quantity supplied of liquid resin 114 depends on the dimensional accuracy of the molding resin. Consequently, it should be controlled with high precision. It is preferred that liquid resin 114 be supplied within ±3% of the volume of cavity 144 of upper die 140, to be explained later.

With regard to the characteristics of liquid resin 114, it is in liquid form at room temperature, and its viscosity is about 30-150 Pa·s, or preferably 45 Pa·s. A consistent viscosity for liquid resin 114 makes it possible to effectively cover the entirety of semiconductor chip 102 with liquid resin 114 supplied from the nozzle. For example, one may make use of an epoxy resin as liquid resin 114, and it can have quick-curing properties.

Figure 3:
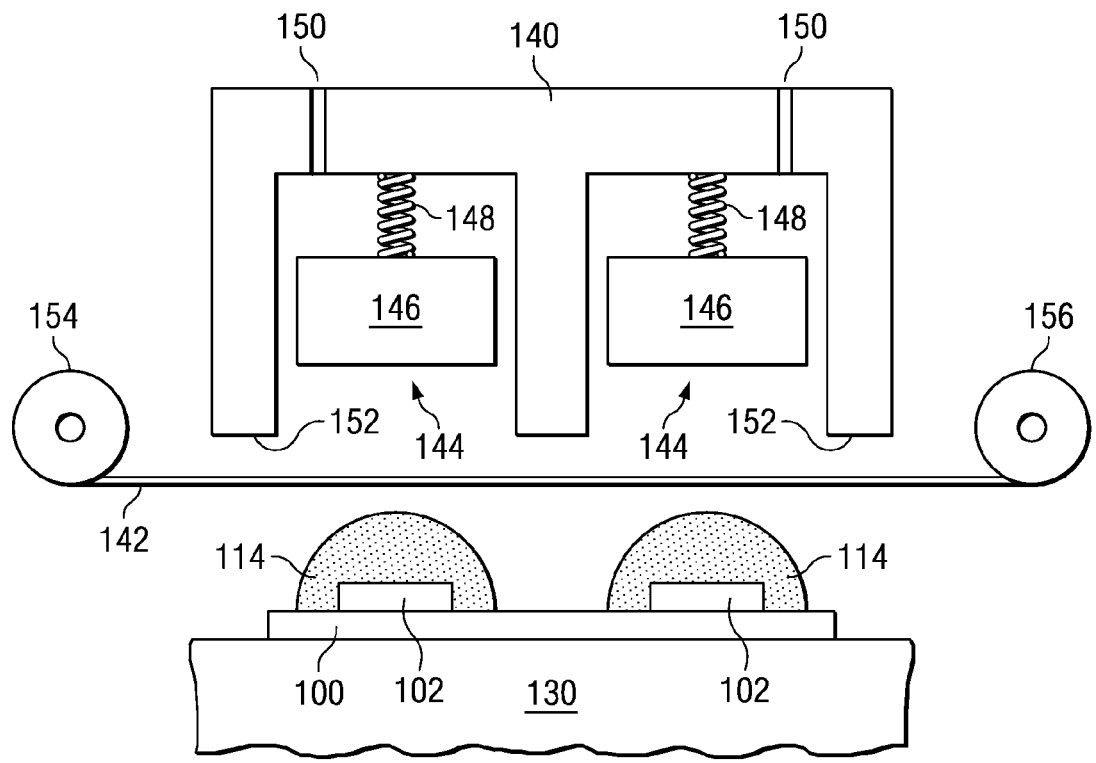
FIG. 3 is a diagram illustrating a process in the molding method in an embodiment of the present invention.

Then, as shown in FIG. 3, substrate 100 is placed on lower die 130. It is preferred that pins or the like for positioning substrate 100 be provided on lower die 130. In this embodiment, the substrate with liquid resin 114 having been fed onto semiconductor chip 102 is placed on lower die 130. However, the present invention is not limited to this scheme. For example, a scheme can also adopted in which liquid resin 114 is fed onto semiconductor chip 102 while semiconductor chip 102 is in place on lower die 130.

Release film 142 is then prepared on the pressure surface side of upper die 140. Plural recesses, that is, cavities 144, are formed in the pressure surface side of upper die 140. These cavities 144 are arranged corresponding to the positions of semiconductor chips 102 on the substrate fixed on the lower die. Pressing member 146 is provided in each cavity 144, and pressing member 146 is elastically supported by spring 148. Said cavity 144 is a rectangular recess surrounded by the pressure surface of pressing member 146 and the side surfaces of leg portions 152, and it defines the outer shape of the molded molding resin. For example, the dimensions of cavity 144 surrounded by the side surfaces of leg portions 152 and by pressing member 146 are 10.9 mm in width, 10.9 mm in length, and 0.27 mm in height. Also, for example, the dimensions of semiconductor chip 102 are 8.8 mm in width, 8.6 mm in length, and 0.1 mm in height.

In addition, air suction hole 150 connected to each cavity 144 is formed in upper die 140. By sucking air through said air suction hole 150, release film 142 is sucked in and adhered along the pressure surface of cavity 144 of upper die 140.

Said release film 142 is supplied from reel 154, and it is taken up by reel 156 (see FIG. 3). Said release film 142 is flexible and heat resistant, and it preferably has the property that it softens at a temperature lower than the temperature of heated upper die 140. In this embodiment, because upper die 140 is heated to about 150° C., the softening temperature of release film 142 is selected to be near 150° C. For example, a flexible film of a thermoplastic fluorine-containing resin (ETFE) can be used.

Also, it is preferred that release film 142 be at least 50 μm thick. As will be explained later, when liquid resin 114 is molded, release film 142 is pressed against substrate 100 by leg portion 152. In this case, liquid resin 114 does not squeeze out from the contact interface between release film 142 and substrate 100. A copper pattern and solder resist are formed on the surface of substrate 100, creating a step of about 20 μm from the surface of the substrate. The thickness of release film 142 is selected to be 50 μm or greater or sufficient to cover the step. More specifically, one surface of release film 142 is processed to roughen it. For example, the roughness can be Rz: 15 μm. The surface that has been processed to roughen it is in contact with upper die 140. As a result, after molding of the liquid resin, release film 142 can be released easily from upper die 140 and wound up on reel 156.

Figure 4:
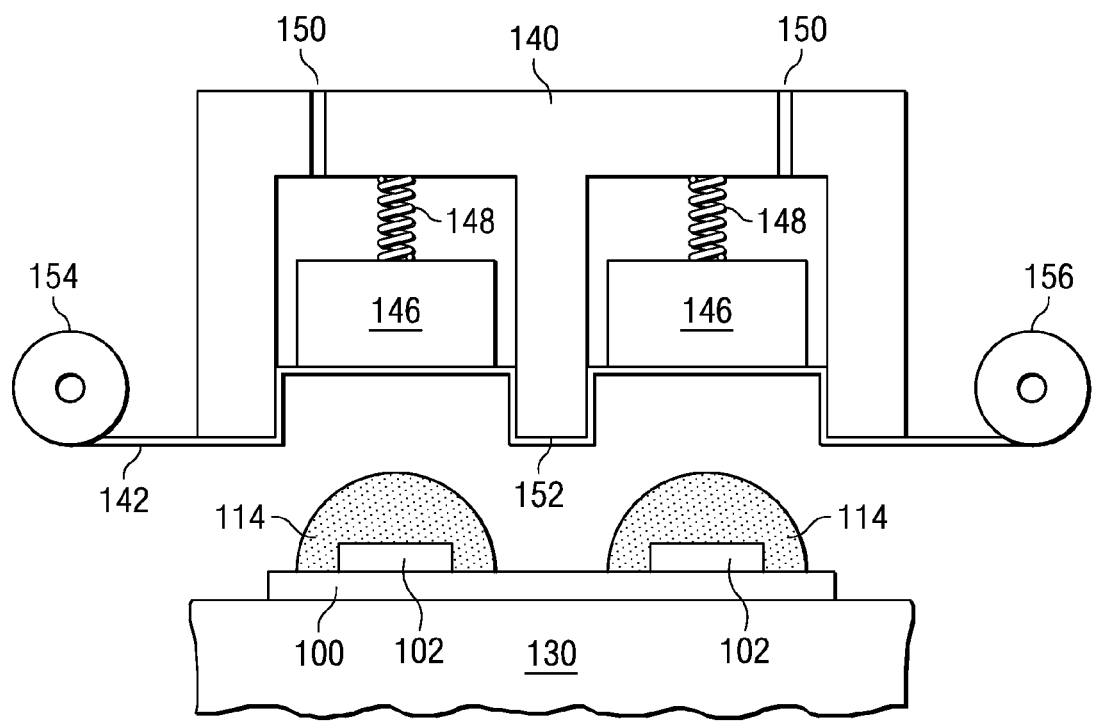
FIG. 4 is a diagram illustrating a process in the molding method in an embodiment of the present invention.

Then, as shown in FIG. 4, upper die 140 is positioned near lower die 130. When they have approached within a prescribed distance of each other, upper die 140 comes into contact with the O-ring (not shown in the figure) of lower die 130, the air in cavity 142 [sic; 144] is evacuated, and a vacuum is established within cavity 142. It is preferred that the degree of absolute vacuum be 5 kPa or better. Also, said upper die 140 and lower die 130 are heated to about 150° C.

Figure 5:
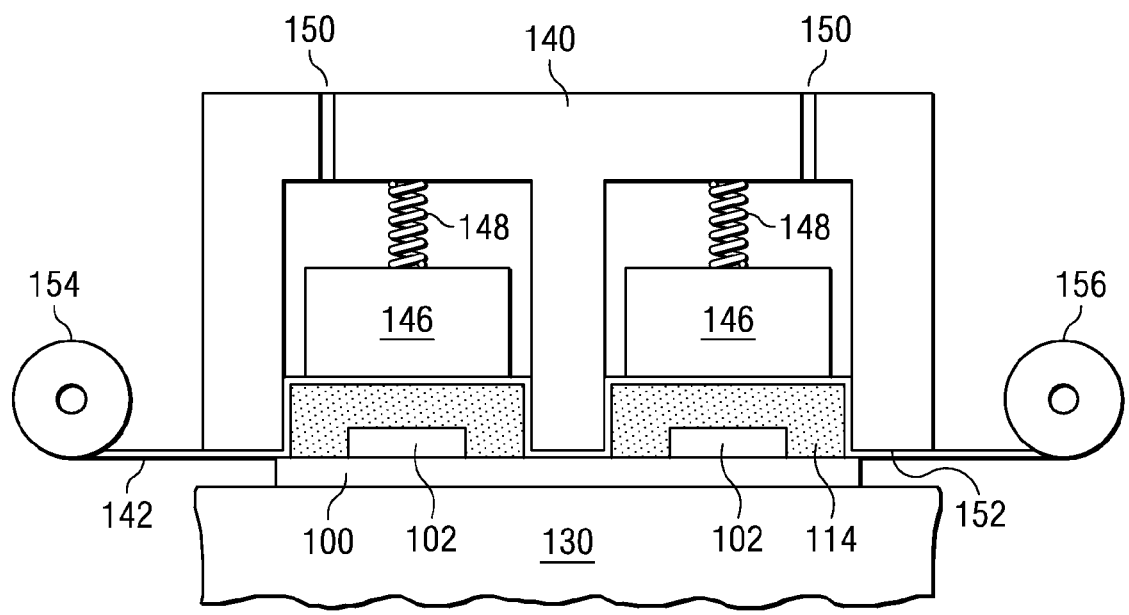
FIG. 5 is a diagram illustrating a process in the molding method in an embodiment of the present invention.

Then, as shown in FIG. 5, upper die 140 is lowered so that leg portions 152 come into contact with substrate 100 with a prescribed contact pressure. As a result, a sealed space is formed over the region including the various semiconductor chips on the substrate. Said pressing member 146 in each cavity 144 makes an elastic pressure molding for liquid resin 114 via release film 142. This state is maintained for about 100 sec. During this period, because leg portions 152 are in contact with substrate 100 at a prescribed contact pressure, no liquid resin 114 is squeezed out of cavity 144. In this way, because liquid resin 114 is pressed and molded at a constant temperature, the molding resin is molded to a shape that reflects the shape of cavity 144.

Figure 6:
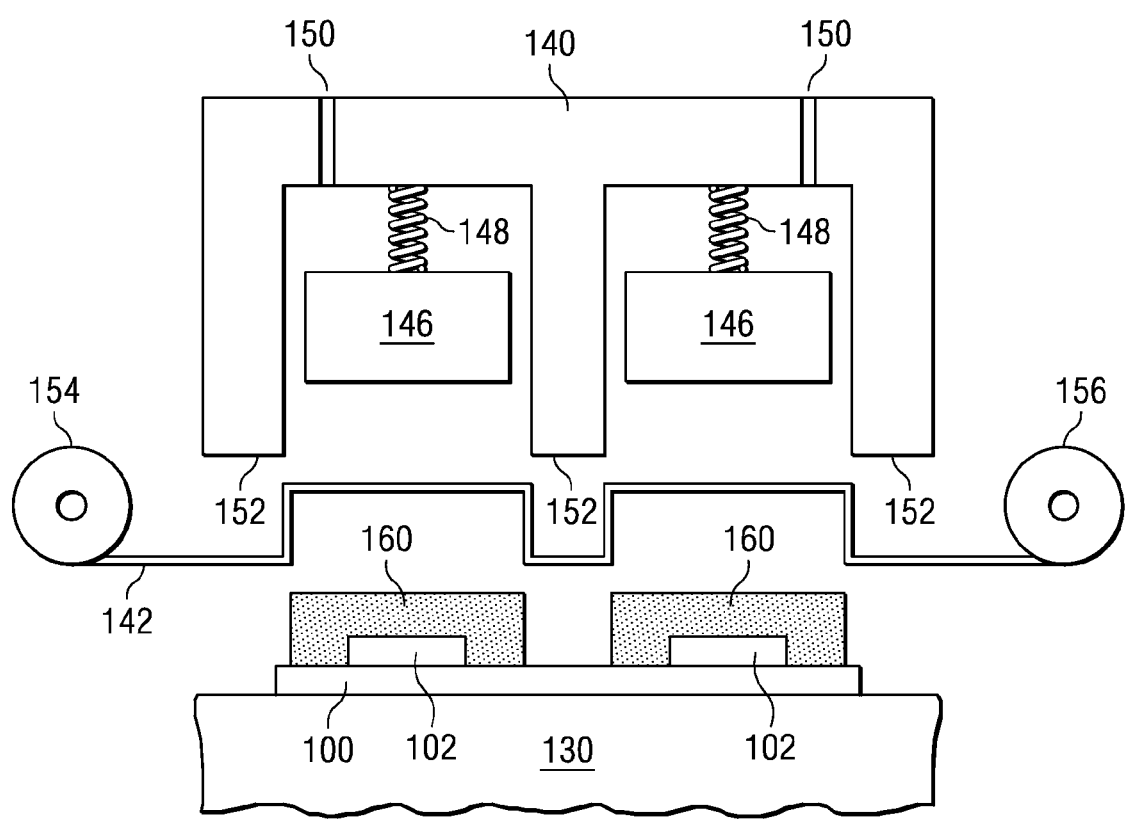
FIG. 6 is a diagram illustrating a process in the molding method in an embodiment of the present invention.

Then, as shown in FIG. 6, upper die 140 is released from lower die 130, and release film 142 is released from the pressure surface of upper die 140 and is wound up on reel 146. At the same time, molding resin 160 on the substrate is released from release film 142. Molding resin portions 160 formed in the same quantity as that of the semiconductor chips are formed on substrate 100, and this molding resin 160 seals off the region containing semiconductor chip 102 and bonding wire 104.

Figure 7A:
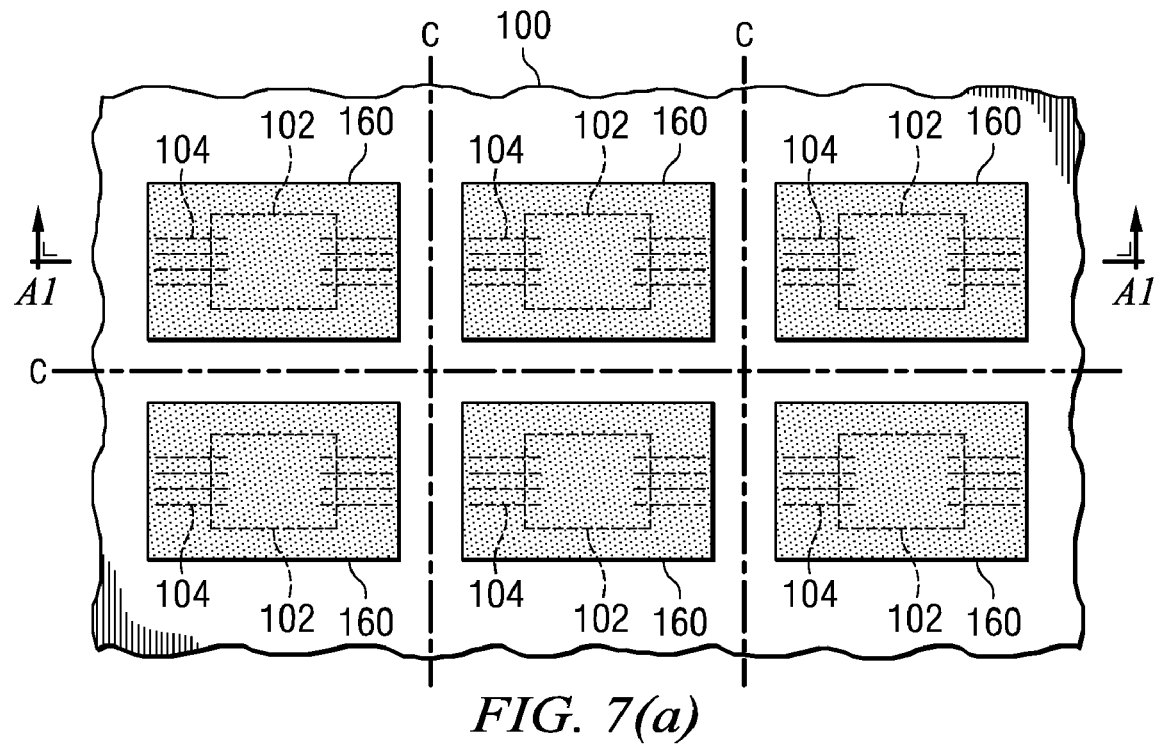
FIGS. 7(a) and 7(b) show a process in the molding method of an embodiment of the present invention.
Figure 7B:
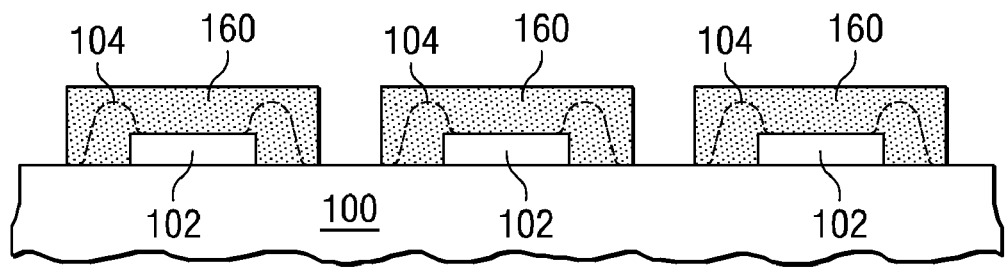

Then, as shown in FIG. 7, substrate 100 is removed from lower die 130. Molding resin 160 to seal semiconductor chip 102 is formed on substrate 100 that is very thin and occupies a very small area.

The subsequent process steps include a process step in which solder balls are connected to the inner surface of substrate 100 as connecting terminals, and a process step in which the substrate is diced. In the dicing process step, the substrate is cut along dicing lines C positioned between molding resin portions 160, 160. That is, molding resin 160 is not cut in the dicing process step. Consequently, the outer shape of molding resin 160 can keep the shape of the cavity as is. As a result, it is possible to eliminate the generation of particles, cracks in the molding resin, and other problems.

In the following, a second embodiment will be explained. In the first embodiment, the internal shape of cavity 144 (recess) of upper die 140 is rectangular. In Embodiment 2, air pockets are formed at the chamfers at the corners of each cavity 144.

Figure 8A:
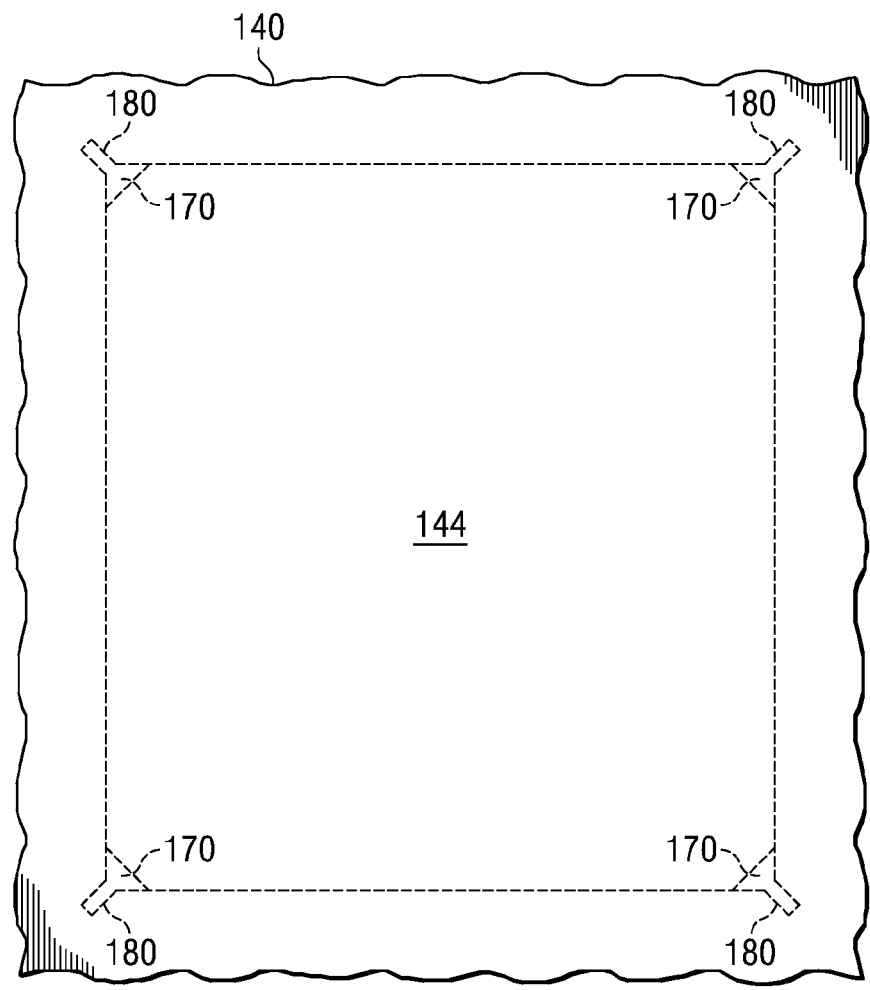
FIGS. 8(a) and 8(b) show the upper die pertaining to Embodiment 2 of the present invention.
Figure 8B:
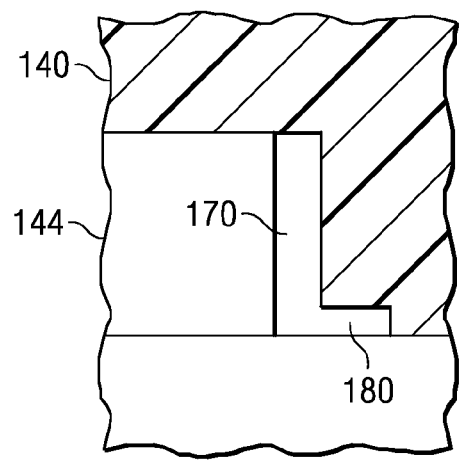

FIG. 8(a) is a schematic plan view of one pressing portion of upper die 140 as viewed from the inner side. FIG. 8(b) is a cross section of a portion of the chamfer region. Chamfer 170 is formed at each corner of cavity 144 of upper die 140. In addition, chamfer 170 extends in a diagonal line and is connected to an air pocket 180, a prescribed closed internal space. Said air pocket 180 at each corner is in a vacuum state and can absorb voids when the liquid resin is molded. That is, when the liquid resin is used in press molding with the interior of cavity 144 in the evacuated state, voids from gas bubbles, etc., in the liquid resin are pressed toward air pocket 180, so that voids are unlikely to remain in the molding resin after the molding operation.

Figures 9A, 9B:
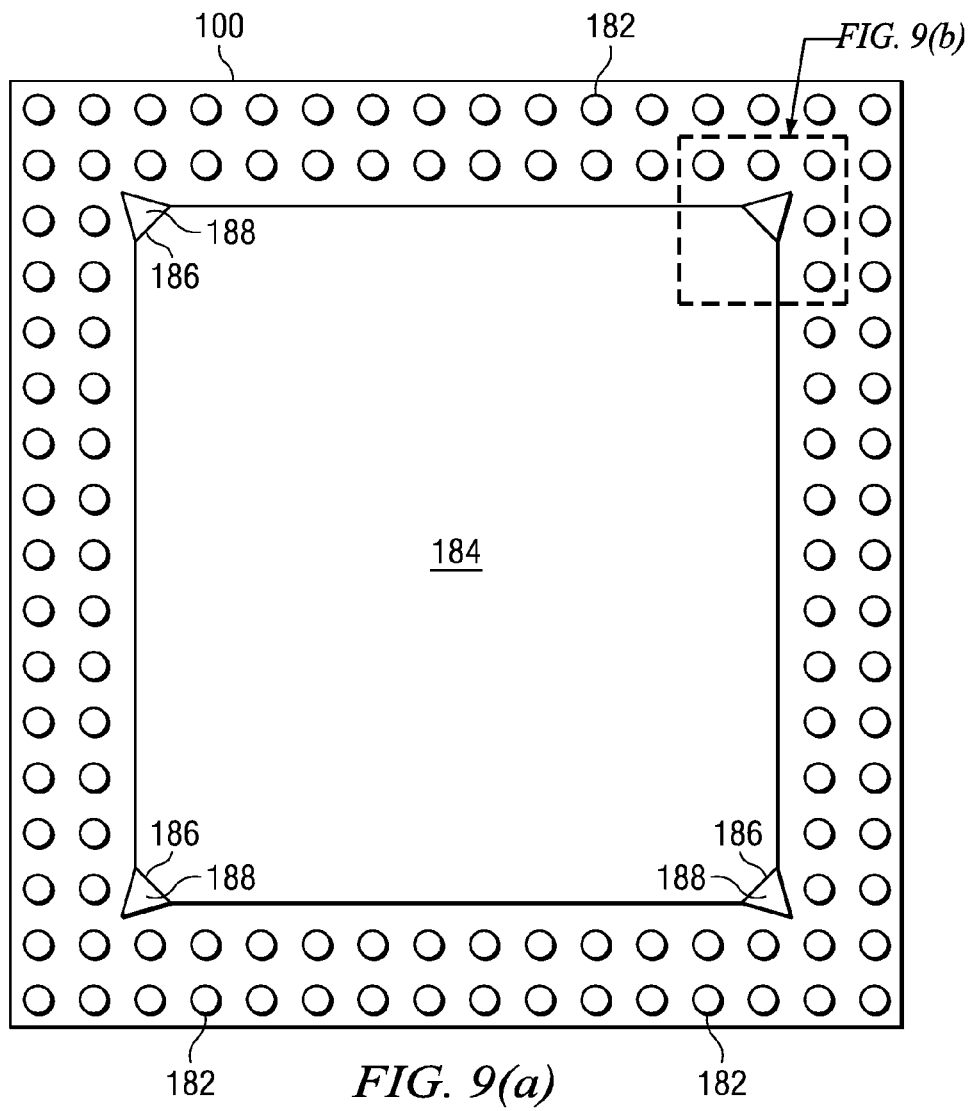
FIG. 9 is a diagram illustrating the outer shape of the molding resin in Embodiment 2.

FIG. 9 is a plan view illustrating the state in which the semiconductor element has been molded using the upper die in Embodiment 2. To simplify the explanation, only a single region of the substrate is shown here. On the upper surface of substrate 100, plural lands 182 are formed connected to a copper pattern. Said lands 182 are regions connected to the solder balls on the inner surface of the substrate via the through-holes formed in substrate 100. The various semiconductor elements on substrate 100 are sealed by molding resin 184. Said molding resin 184 has chamfers 186 formed at the corners matching cavity 144 in upper die 140. In addition, fine protrusions 188 corresponding to air pockets 180 are formed on chamfers 186 of molding resin 184.

In this embodiment, it is possible to eliminate the generation of voids in molding resin 184 by providing air pockets 180. Consequently, it is possible to increase the package yield. The size of air pocket 180 should be appropriate to provide a prescribed volume for absorbing the voids. The acceptable size should permit said fine protrusion 188 to be separated by a prescribed distance D from land 182.

Figure 10:
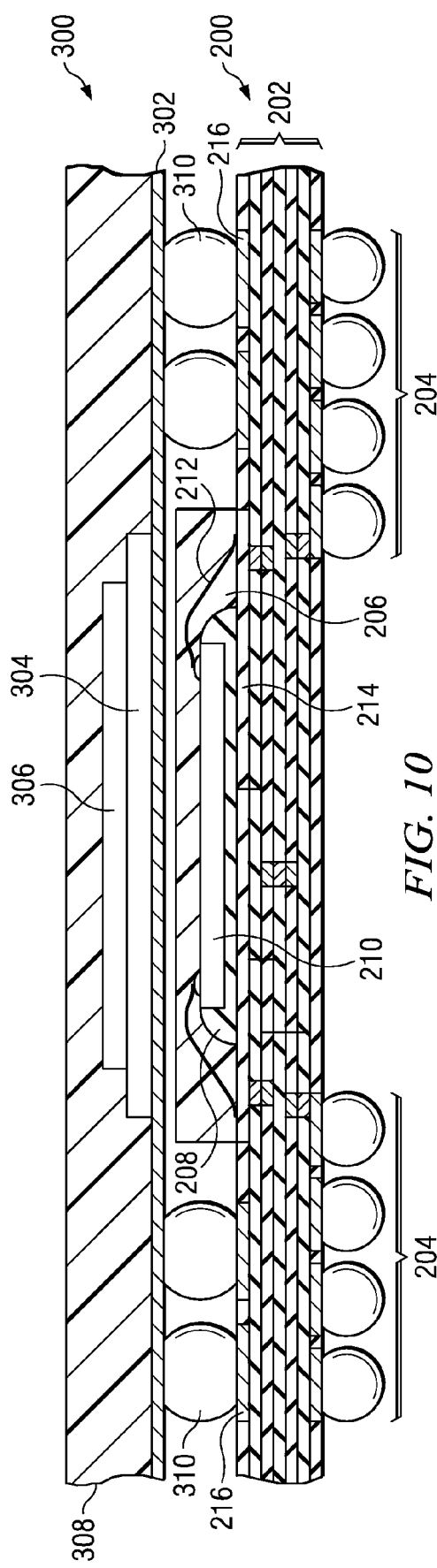
FIG. 10 is a schematic cross section of the stacked structure of the semiconductor device.

In the following, a third embodiment of the present invention will be explained. FIG. 10 is a cross section illustrating the POP (Package On Package) structure in which a second semiconductor device is stacked on a first semiconductor device formed using the molding method in Embodiment 1.

Said first semiconductor device 200 has a BGA package composed of multilayer wiring substrate 202 0.3 mm thick, plural solder balls 204 0.23 mm high formed on the inner surface of multilayer wiring substrate 202, and molding resin 206 formed on the upper surface of multilayer wiring substrate 202. On the upper surface of multilayer wiring substrate 202, semiconductor chips 210 are attached via die attachment 208, and the electrodes of semiconductor chips 210 are connected to copper pattern 214 on the substrate by means of bonding wires 212. The region containing semiconductor chip 210 and bonding wires 212 is sealed with molding resin 206. The loop height of bonding wires 212 from the chip surface is about 0.05 mm. The distance from bonding wires 212 to the surface of molding resin 206 is about 0.095 mm, and the height of the entire package of the first semiconductor device is 0.8 mm.

Second semiconductor device 300 is stacked on said first semiconductor device 200. For example, said second semiconductor device 300 has semiconductor chips 304, 306 stacked on the upper surface of substrate 302 and has said semiconductor chips 304, 306 sealed by molding resin 308. Said molding resin 308 may be of the transfer molding type. Two rows of solder balls 310 are formed in 4 directions on the inner surface of substrate 302.

When second semiconductor device 300 is stacked on first semiconductor device 200, solder balls 310 are arranged surrounding molding resin 206. Solder balls 310 of the second semiconductor device are connected to electrodes 216 formed on the upper surface of substrate 202 of first semiconductor device 200. The height of molding resin 206 from the surface of substrate 202 is about 270 μm, and the height of solder balls 310 from substrate 302 is a little larger. As a result, a small gap is formed between the inner surface of substrate 302 and molding resin 206.

In this way, when the manufacturing method of Embodiment 1 is adopted, by stacking the second semiconductor device on first semiconductor device 200 with very thin and small molding resin 206, it is possible to obtain a thin POP structure. It is similarly possible to obtain a thin POP structure using the manufacturing method of Embodiment 2.

Figure 11A:
FIG. 11 is a diagram illustrating warping of the semiconductor device.
Figure 11B:
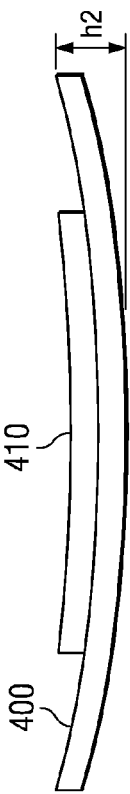
Figure 13A:
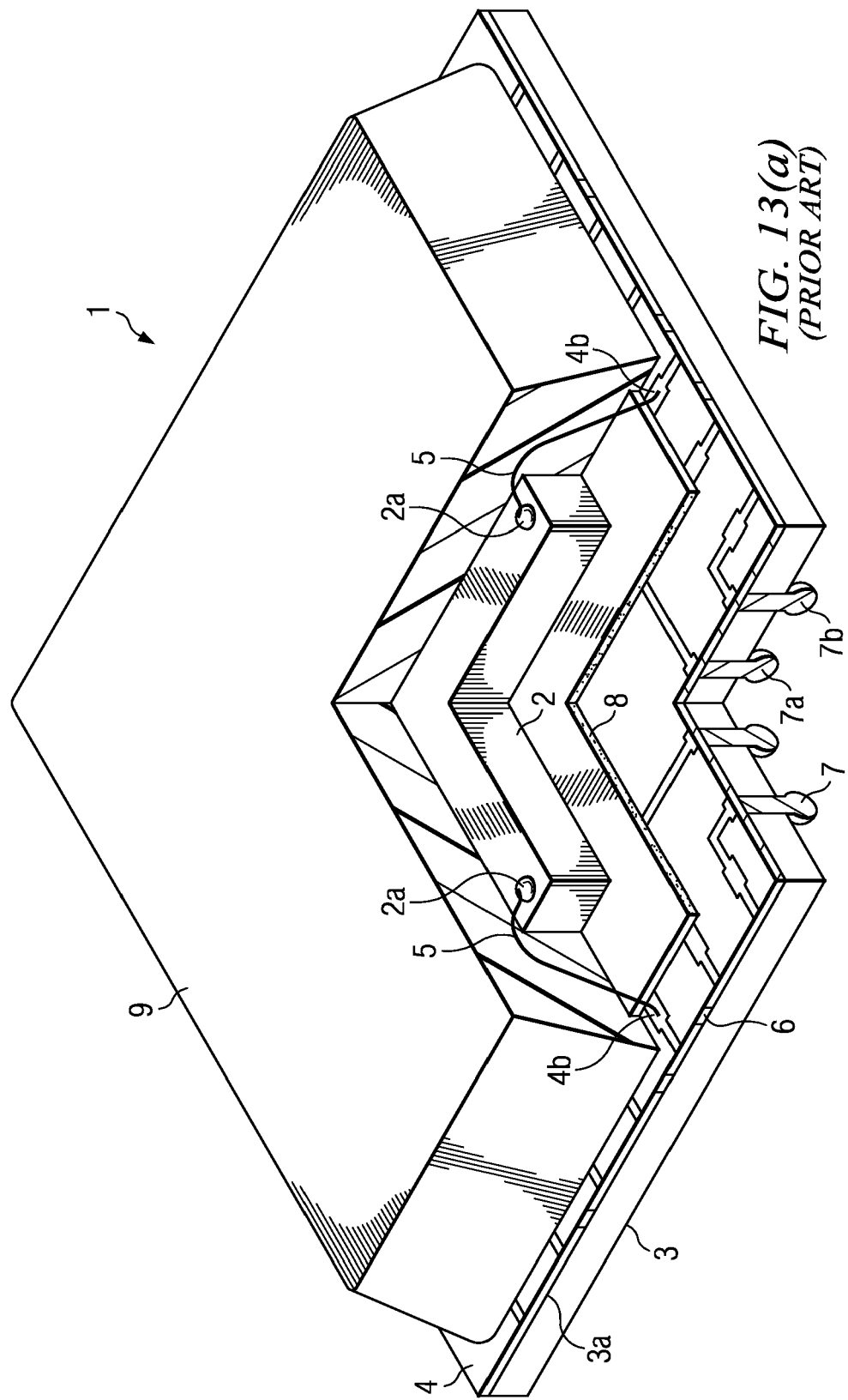
Figure 14A:
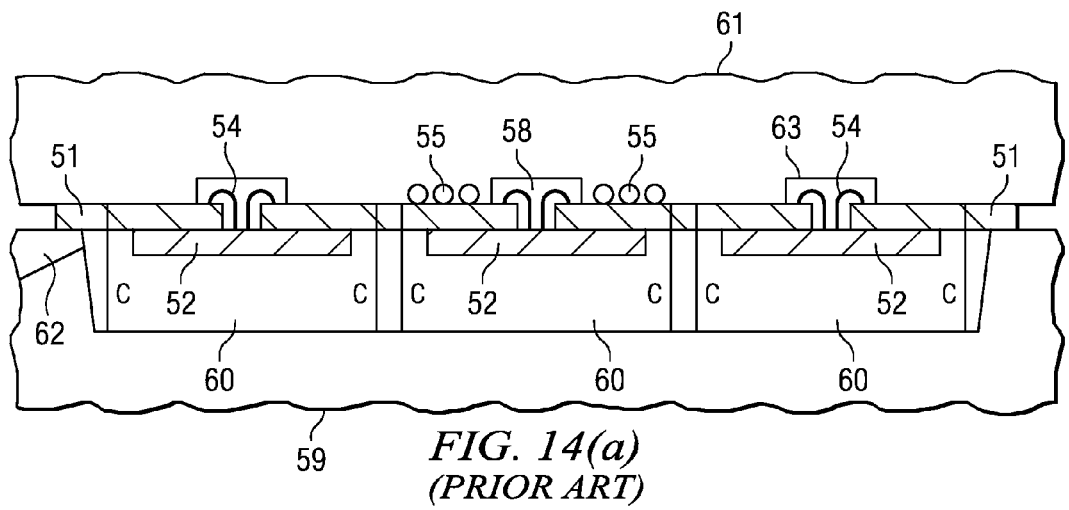
FIG. 14(a) and FIG. 14(b) depicts the method of molding a matrix substrate in the prior art.
Figure 14B:
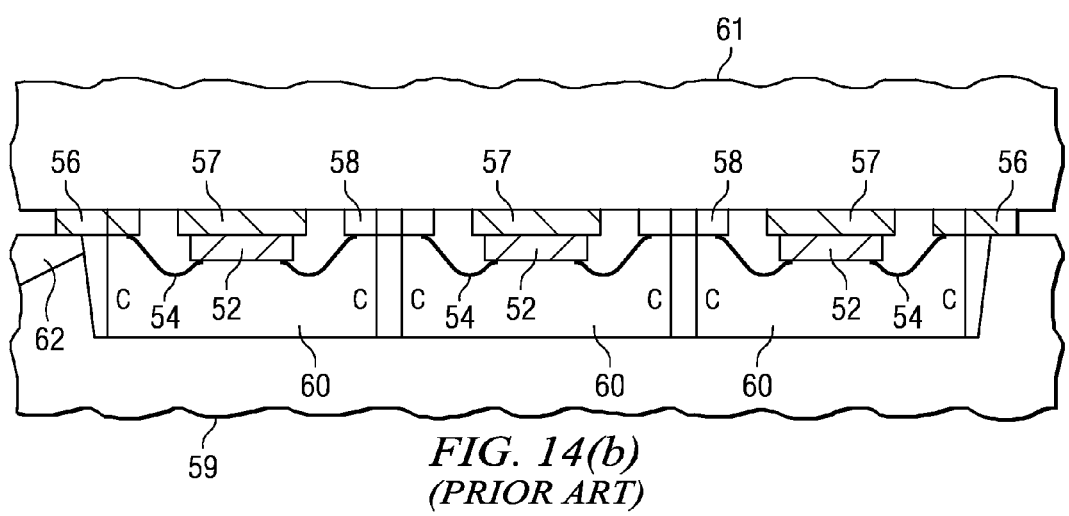

In the following, a fourth of the present invention will be explained. When semiconductor device 200 manufactured using the method in Embodiment 1 (see FIG. 10) is assembled on a substrate, it is exposed to a high temperature when it is passed through a reflowing oven, so that the substrate warps. FIG. 11 illustrates schematically the warping of the semiconductor device. As shown in FIG. 11(a), substrate 400 and molding resin 410 undergo positive warping to form a concave shape. As shown in FIG. 11(b), they undergo negative warping to form a convex shape. Assuming the distances from the bottom surface of substrate 400 to the top surface of molding resin 410 are h1 and h2, if the magnitudes of h1, h2 exceed 150 μm, defective bonding between the solder balls and the substrate is apt to occur.

In this embodiment, in order to reduce warping h1, h2 of the substrate, a liquid resin is selected with the characteristics shown in FIG. 12(a). CTE1 is the linear expansion coefficient in the temperature region below the glass transition temperature, and CTE2 represents the linear expansion coefficient in the temperature region above the glass transition temperature. YM1 represents the longitudinal modulus (Young's modulus) in the temperature region below the glass transition temperature. YM2 represents the longitudinal modulus (Young's modulus) in the temperature region above the glass transition temperature. FIG. 12(a) shows two conditions A, B. It is preferred that a liquid resin corresponding to condition B be used. Also, the constitution of semiconductor device 200 is shown in FIG. 12(b). The semiconductor chip is a silicon chip 8.8 mm wide, 8.6 mm long, 0.1 mm high. Also, the multilayer wiring substrate is made of BT with a linear expansion coefficient of about 17 ppm in the temperature range of 30-200° C. The dimensions are 1.4 mm wide, 1.4 mm long and 0.3 mm high.

In this constitution, the magnitudes of semiconductor device warping at room temperature (for example, 25° C.) h1 and h2 are 80 μm or less, and the warping magnitudes h1, h2 of the semiconductor device at high temperature (for example, 260° C.) are 110 μm or less. As a result, good solder contact can be realized during substrate assembly.

Preferred embodiments of the present invention have been explained in detail above. However, the present invention is not limited to these embodiments. Various modifications and changes can be made as long as they remain within the scope of the present invention described in the claims.

In the aforementioned embodiments, the method of manufacturing BGA or CSP type semiconductor devices has been described. However, other types of semiconductor devices may also be adopted. There is no special limitation on the constitution of the package, and it is only required that the semiconductor chips carried on one surface of the substrate be sealed by resin. In addition, with regard to the method of assembling the semiconductor chips on the substrate, in addition to the connection method using wire bonding, connection can also be performed by means of the face-down scheme. In addition, in the aforementioned embodiments the cavities formed in the upper die are rectangular. However, the cavity may also have a sloping side surface so that the side surface of the resin molding is inclined.

The molding method of the semiconductor chip pertaining to the present invention can be used to substitute for the conventional transfer molding method and bonding method. By using the molding method of the present invention, an ultra-small and ultra-thin semiconductor device with high dimensional accuracy can be provided. In particular, it is possible to realize an ultra-thin semiconductor device of the surface assembly type.

The invention claimed is:

1. A method of manufacturing a semiconductor device; comprising:
   providing a substrate with a first surface and a second surface;

disposing a plurality of semiconductor elements on the first surface of the substrate;

placing the second surface opposite to the first surface of the substrate on a supporting member;

dispensing a liquid resin at a temperature to each of the semiconductor elements to cover at least a portion of each semiconductor element; the liquid resin having a glass transition temperature in the range of 100-160° C., a coefficient of thermal expansion in the temperature region below the glass transition temperature in the range of 20-30 ppm, a coefficient of thermal expansion in the temperature region above the glass transition temperature in the range of 80-120 ppm, a longitudinal modulus in the temperature region below the glass transition temperature in the range of 1-20 GPa, and a longitudinal modulus in the temperature region above the glass transition temperature in the range of 0.1-1.0 GPa;

providing a mold part having a plurality of recesses formed in one surface;

pressing the mold part onto the supporting part;

providing thermal energy to mold the liquid resin and each semiconductor element within each said recess at a temperature higher than the dispensing temperature; and releasing the recesses of the mold part from the substrate.

2. The manufacturing method of claim 1, further comprising dispensing the liquid resin from a nozzle, which scans the first surface of the substrate.

3. The manufacturing method of claim 1 in which the quantity of the liquid resin dispensed on each semiconductor element is in the range of ±3% with respect to the volume of the recess of the mold part.

4. The manufacturing method of claims 1 in which the liquid resin is in liquid form at room temperature, and it has a viscosity in the range of 30-150 Pa·s.

5. The manufacturing method of claims 1 in which the liquid resin is molded at about 150° C.

6. The manufacturing method of claim 1 further comprising attaching a flexible film on the plurality of recesses of the mold part.

7. The manufacturing method of claim 6 in which attached comprises sucking air through air suction holes in the mold part.

8. The manufacturing method of claim 6 in which the film soft near a molding temperature of the liquid resin.

9. The manufacturing method of claims 6 in which the surface of the film that is to contact the plurality of recesses is rough.

10. The manufacturing method described of claims 6 in which the film is at least 50 µm thick.

11. The manufacturing method of claims 6 in which the film is made of a thermoplastic fluorine-containing resin (ETFE).

12. The manufacturing method of claim 1 further comprising evacuating the atmosphere around the liquid resin before molding the liquid resin.

13. The manufacturing method of claim 12 further comprising evacuating the atmosphere around the liquid resin before molding the liquid resin to a vacuum of 5 kPa or lower.

14. The manufacturing method of claim 1 in which the recesses of the mold part allow independent elastic displacement.

15. The manufacturing method of claim 1 in which the recesses of the mold part include chamfered corners.

16. The manufacturing method of claim 15 in which the chamfered corners are connected to air pockets.

17. The manufacturing method of claim 1 further comprising cutting the substrate corresponding to the area of the molded semiconductor elements.

18. The manufacturing method described in claim 1 further comprising attaching connecting-terminals to the second surface of the substrate.

19. The manufacturing method of claims 1 further comprising stacking a second semiconductor element on top of a semiconductor element.

20. The manufacturing method of claims 1 further comprising:

providing a wiring pattern on the first surface of the substrate;

providing a second semiconductor device with connecting terminals on a surface, the connecting terminals having a height; and electrically connecting the connecting terminals to the wiring pattern.

21. The manufacturing method of claim 20 in which the molding resin is between the substrate and the second semiconductor device.

22. The manufacturing method of claim 20 in which the height of the connecting terminals of the second semiconductor device is higher than the molding resin.

23. The manufacturing method of claim 20, further comprising electrically connecting the first semiconductor element to the wiring pattern.

24. The manufacturing method of claim 23 in which the electrical connection is by means of wire-bonding.

25. The manufacturing method of claim 1 in which at least one wiring layer is disposed between the first surface and the second surface of the substrate.

26. The method of manufacturing a semiconductor device in claim 1 in which the liquid resin has a glass transition temperature in the range of 130-160° C., a coefficient of thermal expansion in the temperature region below the glass transition temperature in the range of 24-25 ppm, a coefficient of thermal expansion in the temperature region above the glass transition temperature in the range of 90-100 ppm, a longitudinal modulus in the temperature region below the glass transition temperature in the range of 9-11 GPa, and a longitudinal modulus in the temperature region above the glass transition temperature in the range of 0.2-0.5 GPa.

27. The method of manufacturing a semiconductor device in claim 1 in which the coefficient of thermal expansion of the substrate in the temperature region of 30-200° C. is about 17 ppm.

\* \* \* \* \*